(12) United States Patent
Feltsman

(10) Patent No.: US 7,008,517 B2
(45) Date of Patent: Mar. 7, 2006

(54) SHUTTER DISK AND BLADE FOR PHYSICAL VAPOR DEPOSITION CHAMBER

(75) Inventor: Michael Feltsman, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 127 days.

(21) Appl. No.: 10/626,471

(22) Filed: Jul. 24, 2003

(65) Prior Publication Data

US 2004/0182698 A1     Sep. 23, 2004

Related U.S. Application Data

(63) Continuation-in-part of application No. 10/082,480, filed on Feb. 20, 2002, now Pat. No. 6,669,829.

(51) Int. Cl.
*C23C 14/34*     (2006.01)

(52) U.S. Cl. .............................. 204/192.1; 204/298.11

(58) Field of Classification Search ............. 204/192.1, 204/298.11
See application file for complete search history.

(56) References Cited

U.S. PATENT DOCUMENTS

| | | | |
|---|---|---|---|
| 4,819,167 A | 4/1989 | Cheng et al. | 364/167.01 |
| 5,223,112 A * | 6/1993 | Tepman | 204/298.11 |
| 5,452,521 A | 9/1995 | Niewmierzycki | 33/520 |
| 5,483,138 A | 1/1996 | Shmookler et al. | 318/568.16 |
| 5,844,683 A | 12/1998 | Pavloski et al. | 356/399 |
| 5,917,601 A | 6/1999 | Shimazaki et al. | 356/375 |
| 5,980,194 A | 11/1999 | Freerks et al. | 414/754 |
| 6,002,840 A | 12/1999 | Hofmeister | 395/80 |
| 6,051,113 A | 4/2000 | Moslehi | 204/192.12 |
| 6,176,978 B1 | 1/2001 | Ngan | 204/192.12 |
| 6,198,976 B1 | 3/2001 | Sundar et al. | 700/59 |
| 6,244,121 B1 | 6/2001 | Hunter | 73/865.9 |
| 6,313,596 B1 | 11/2001 | Wyka et al. | 318/640 |
| 2002/0088771 A1 * | 7/2002 | Hixson et al. | 216/67 |

* cited by examiner

*Primary Examiner*—Rodney G. McDonald
(74) *Attorney, Agent, or Firm*—Patterson & Sheridan, LLP

(57) ABSTRACT

The present invention generally provides a method and apparatus for use in a physical vapor deposition chamber. In one embodiment, invention provides a shutter disk mechanism that eliminates the need for axially orientating a shutter disk to a robot blade that transfers the shutter disk to a substrate support.

35 Claims, 7 Drawing Sheets

SHUTTER DISK AND BLADE FOR PHYSICAL VAPOR DEPOSITION CHAMBER

CROSS-REFERENCE TO RELATED APPLICATIONS

This application is a continuation-in-part of U.S. patent application Ser. No. 10/082,480, filed Feb. 20, 2002, and issued as U.S. Pat. No. 6,669,829 on Dec. 30, 2003, which is hereby incorporated by reference in its entirety.

BACKGROUND OF THE INVENTION

1. Field of the Invention

Embodiments of the invention generally relate to a physical vapor deposition chamber.

2. Description of the Related Art

Many semiconductor processes are typically performed in a vacuum environment. For example, physical vapor deposition (PVD) is generally performed in a sealed chamber having a pedestal for supporting the substrate disposed thereon. The pedestal typically includes a substrate support that has electrodes disposed therein to electrostatically hold the substrate against the substrate support during processing. A target generally comprised of a material to be deposited on the substrate is supported above the substrate, typically fastened to a top of the chamber. A plasma formed from a gas, such as argon, is supplied between the substrate and the target. The target is biased, causing ions within the plasma to be accelerated toward the target. Ions impacting the target cause material to become dislodged from the target. The dislodged material is attracted toward a substrate and deposits a film of material thereon.

Generally, two conditioning operations are performed in the PVD chamber to ensure process performance. A first conditioning process is known as burning-in the target. Target burn-in generally removes oxides and other contaminants from the surface of the target and is typically performed after the chamber has been exposed to atmosphere or idled for a period of time. During the burn-in process, a utility wafer or shutter disk is disposed on the substrate support to prevent deposition of target material on the support. The burn-in process generally comprises forming a plasma within the chamber and using that plasma to remove the surface layer of material from the target.

A second conditioning process is known as pasting. Pasting generally applies a covering over material deposited on chamber components during a conventional PVD process. For example, PVD application of titanium nitride generally results in a layer of titanium nitride on the PVD chamber surfaces. The titanium nitride layer is typically brittle and may flake off during subsequent processes. Pasting generally applies a layer of titanium over the titanium nitride layer. The titanium layer substantially prevents the underlying titanium nitride from flaking or peeling. Typically, the chamber is pasted at predetermined intervals, such as after every 25 substrates are processed using a conventional titanium nitride PVD process. As with target burn-in, a shutter disk is disposed on the substrate support to prevent deposition of target material thereon during the pasting process.

Additionally, in PVD processes where titanium and titanium nitride are sequentially applied in-situ, the target requires cleaning prior to each titanium deposition to remove nitrides that may be present on the target from titanium nitride deposited on the prior substrate. Generally, target cleaning is similar to a burn-in process, having a few seconds duration, and includes protecting the substrate support with a shutter disk.

After completion of each burn-in, pasting and cleaning process, the shutter disk is rotated by a robotic arm disposed within the PVD chamber to a cleared position where the shutter disk does not interfere with the deposition process within the chamber. To center the position of the shutter disk, a sensor is employed on a shaft coupled to the robotic arm to detect the rotational position of the arm.

A problem with this arrangement for detecting the position of the shutter disk in the cleared position is that the sensor does not have the capability of confirming the relative position of the shutter disk to the robotic arm. For example, misalignment between the shutter disk and the robotic arm may result in a portion of the shutter disk remaining in the path of the ceramic substrate support. As the ceramic support is elevated into a process position, a portion of the substrate may contact the shutter disk, which may result in damage to the substrate or misalignment of the substrate on the ceramic support. Moreover, if the shutter disk comes in contact with the ceramic support, the ceramic support may become chipped or damaged and necessitate replacement. Additionally, if the shutter disk is not properly aligned on the robotic arm, the disk may be misaligned relative to the ceramic support during the burn-in and pasting process, thereby resulting in unwanted deposition on a portion of the ceramic support. Deposition material on the ceramic support may lead to particular generation, scratching of the wafer and a deterioration of process performance.

Therefore, there is a need for a PVD processing chamber having an improved shutter disk sensing system.

SUMMARY OF THE INVENTION

The present invention generally provides a method and apparatus for use in a physical vapor deposition chamber. In one aspect of the invention, a shutter disk mechanism is provided that eliminates the need for axially orientating a shutter disk to a robot blade that transfers the shutter disk to a substrate support.

In one embodiment, a shutter disk for covering a substrate support in a physical vapor deposition chamber includes a disk body defined by an outer edge, a top surface extending to the outer edge and a lower surface disposed opposite the top surface. The lower surface of the disk body includes a center pad and a lip. The center pad has a recess formed therein coaxially with the disk body. The lip extends from the lower surface proximate the outer edge below the center pad.

In another embodiment, a physical vapor deposition chamber includes a chamber body having a disk body disposed therein. A housing is sealingly coupled to a sidewall of the chamber body. The disk body has a center axis and is defined by an outer edge, a top surface extending to the outer edge and a lower surface disposed opposite the top surface. The lower surface of the disk body includes a center pad extending from the lower surface and a lip extending from the lower surface proximate the outer edge where the lip extending below the center pad. An alignment feature is disposed between the center pad and a blade of a robot adapted to move the disk body between the housing and the chamber body. The alignment feature is configured to engage the disk body along the center axis.

In one embodiment, a method for positioning a shutter disk within a physical vapor deposition chamber having a substrate support generally includes spacing a shutter disk vertically from a substrate support; moving a robot blade between the substrate support and the shutter disk, and engaging the shutter disk and the robot blade with an alignment feature disposed along a center axis of the shutter disk.

BRIEF DESCRIPTION OF THE DRAWINGS

A more particular description of the invention, briefly summarized above, may be had by reference to the embodiments thereof, which is illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION

The invention generally provides a semiconductor processing system having a sensor assembly adapted to detect a cleared position of a utility wafer, such as a shutter disk. The cleared position is defined as a position where a substrate support (and substrate seated thereon) may move vertically without contacting the shutter disk or mechanisms associated with the movement of the shutter disk. Although the invention is described in a physical vapor deposition chamber, the disclosure is one of illustration, and accordingly, the invention finds utility in other semiconductor processing chambers where it is advantageous to confirm a cleared position of a utility wafer or other device which may be disposed over a substrate support between substrate processing operations.

Figure 1:
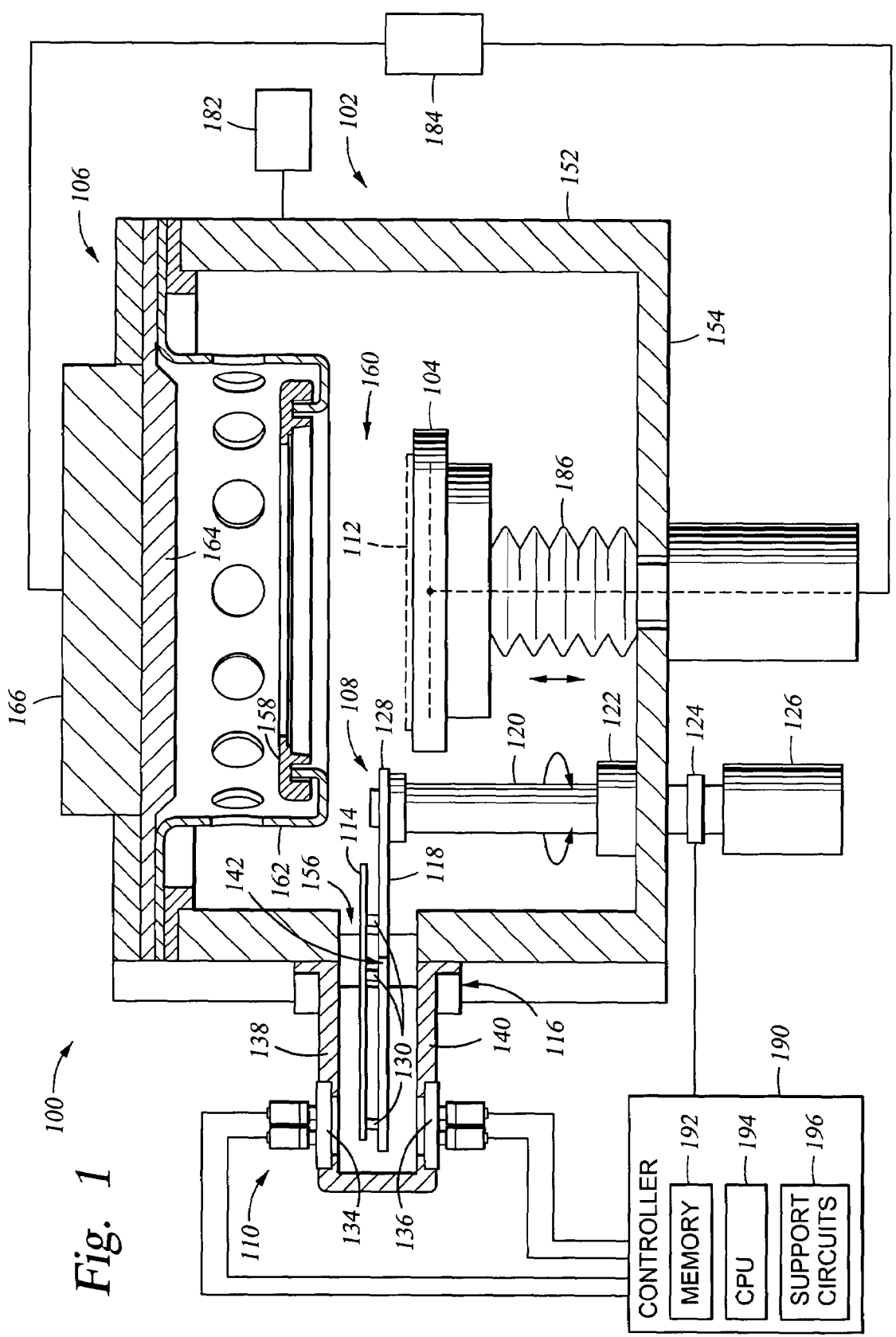
FIG. 1 depicts a semiconductor processing chamber having one embodiment of a sensor assembly adapted to detect a position of a shutter disk mechanism.

FIG. 1 depicts a semiconductor process chamber 100 that includes one embodiment of a sensor assembly 110 adapted to detect a cleared position of a utility wafer or shutter disk 114. Generally, the sensor assembly 110 is utilized to ensure that the shutter disk 114 is not in a position that would contact a substrate support 104 or a substrate 112 seated thereon during processing. One example of a process chamber 100 that may be adapted to benefit from the invention is an IMP VECTRA™ PVD process chamber, available from Applied Materials, Inc., located in Santa Clara, Calif.

The exemplary process chamber 100 includes a chamber body 102 and lid assembly 106 that define an evacuable process volume 160. The chamber body 102 is typically fabricated from a unitary block of aluminum or welded stainless steel plates. The chamber body 102 generally includes sidewalls 152 and a bottom 154. The sidewalls generally contain a plurality of apertures that include an access port, pumping port and a shutter disk port 156 (access and pumping ports not shown). The sealable access port provides for entrance and egress of the substrate 112 from the process chamber 100. The pumping port is coupled to a pumping system (also not shown) that evacuates and controls the pressure within the process volume 160. The shutter disk port 156 is configured to allow at least a portion of the shutter disk 114 therethrough when the shutter disk 114 is in the cleared position. A housing 116 generally covers the shutter disk port 156 to maintain the integrity of the vacuum within the process volume 160.

The lid assembly 106 of the body 102 generally supports an annular shield 162 suspended therefrom that supports a shadow ring 158. The shadow ring 158 is generally configured to confine deposition to a portion of the substrate 112 exposed through the center of the shadow ring 158.

The lid assembly 106 generally includes a target 164 and a magnetron 166. The target 164 provides material to be deposited on the substrate 112 during the PVD process, while the magnetron 166 enhances uniform consumption of the target material during processing. The target 164 and substrate support 104 are biased relative each other by a power source 184. A gas such as argon is supplied to the process volume 160 from a gas source 182. A plasma is formed between the substrate 112 and the target 164 from the gas. Ions within the plasma are accelerated toward the target 164 and cause material to become dislodged from the target 164. The dislodged target material is attracted towards the substrate 112 and deposits a film of material thereon.

The substrate support 104 is generally disposed on the bottom 154 of the chamber body 102 and supports the substrate 112 during processing. The substrate support 104 is coupled to the bottom 154 by a lift mechanism (not shown) that is configured to move the substrate support 104 between a lower (as shown) and an upper position. The substrate support 104 is moved into the upper position for processing. In the upper position, the substrate 112 is disposed on the substrate support 104 and engages the shadow ring 158, lifting the shadow ring 158 from the shield 162.

In the lower position, the substrate support 104 is positioned below the shield 162 to allow the substrate 112 to be removed from the chamber 100 through the port in the sidewall 152 while clearing the ring 158 and shield 162. Lift pins (not shown) are selectively moved through the substrate support 104 to space the substrate 112 from the substrate support 104 to facilitate securing of the substrate 112 by a wafer transfer mechanism disposed exterior to the process chamber 100 such as a single blade robot (not shown). A bellows 186 is typically disposed between the substrate support 104 and the chamber bottom 154 and provides a flexible seal therebetween, thereby maintaining vacuum integrity of the chamber volume 160.

The substrate support 104 is typically fabricated from aluminum, stainless steel, ceramic or combinations thereof. One substrate support 104 that may be adapted to benefit from the invention is described in U.S. Pat. No. 5,507,499, issued Apr. 16, 1996 to Davenport et al., which is incorporated herein by reference in its entirety.

A shutter disk mechanism 108 is generally disposed proximate the substrate support 104. The shutter disk mechanism 108 generally includes a blade 118 that supports the shutter disk 114 and an actuator 126 coupled to the blade 118 by a shaft 120. A rotary seal 122 is disposed through the chamber bottom 154 to allow rotation of the shaft 120 without vacuum leakage from the process volume 160.

The actuator 126 generally controls the angular orientation of the blade 118. Typically, the blade 118 is moved between the cleared position shown in FIG. 1 and a second position that places the shutter disk 114 substantially concentric with the substrate support 104. In the second position, the shutter disk 114 may be transferred (by utilizing the lift pins) to the substrate support 104 during the target burn-in and chamber pasting process. Typically, the blade 118 is returned to the cleared position during the target burn-in and chamber pasting process.

The actuator 126 may be any device that may be adapted to rotate the shaft 120 through an angle that moves the blade 118 between the cleared and second positions. The actuator 126 may be an electric, hydraulic or air motor, a pneumatic or hydraulic cylinder, or a solenoid, among other motion devices. The actuator 126 may include a shaft sensor 124 that detects when the shaft 120 is rotated to the second position. The shaft sensor 124 may be directly coupled to the actuator 126, as with a rotary encoder or limit switch, or may interface with the shaft 120, as with a limit switch. Other sensors 124 that may be adapted to detect the angular position of the shaft 120 may also be utilized.

The blade 118 generally supports the shutter disk 114 in a horizontal orientation. The blade 118 typically has a flat body 142 that includes a hub 128 that is coupled to the shaft 120, and at least three disk support pins 130 extending therefrom. The pins 130 generally support the shutter disk 114 in a spaced-apart relation to the blade 118. The blade 118 is configured to allow rotation of the blade 118 from the second position to the cleared position without contacting the lift pins extending from the blade 118. The blade 118 additionally includes a tab 220 (shown in FIG. 2A) that extends beyond the perimeter of the shutter disk 114.

A portion of the shutter disk 114 is disposed in the housing 116 when in the cleared position. The housing 116 is typically fabricated from the same material as the chamber body 102. The housing 116 is sealingly fastened to the chamber body 102, and in one embodiment, is continuously welded at the interface between the housing 116 and body 102 to ensure a vacuum-tight joint.

The housing 116 generally includes at least a first window 134 sealingly disposed through the housing 116. The first window 134 is positioned to allow the sensor assembly 110 to detect the presence of the shutter disk 114 and/or the blade 118 within the housing 116. In the embodiment depicted in FIG. 1, the housing 116 additionally includes a second window 136 formed in a bottom section 140 of the housing 116 opposite the first window 134 that is formed in a top section 138 of the housing 116. The windows 134, 136 are fabricated from a material substantially transparent or non-invasive to the detection mechanism of the sensor assembly 110, for example, quartz.

The sensor assembly 110 is generally disposed proximate the housing 116. The sensor assembly 110 generally includes at least one sensor that is adapted to detect the presence of the blade 118 and/or shutter disk 114 within the housing 116, preferably when in the cleared position.

The sensor assembly 110 is coupled to a controller 190 that interfaces with and typically controls the processing system 100. The controller 190 typically comprises a central processing unit (CPU) 194, support circuits 196 and memory 192. The CPU 194 may be one of any form of computer processor that can be used in an industrial setting for controlling various chambers and sub-processors. The memory 192 is coupled to the CPU 194. The memory 192, or computer-readable medium, may be one or more of readily available memory such as random access memory (RAM), read only memory (ROM), floppy disk, hard disk, or any other form of digital storage, local or remote. The support circuits 196 are coupled to the CPU 194 for supporting the processor in a conventional manner. These circuits include cache, power supplies, clock circuits, input/output circuitry, subsystems, and the like. The sensors, at least including one of the sensor assembly 110 and the shaft sensor 124, provide information to the controller 190 regarding the position of the shutter disk 114 and/or the blade 118.

Figure 2A:
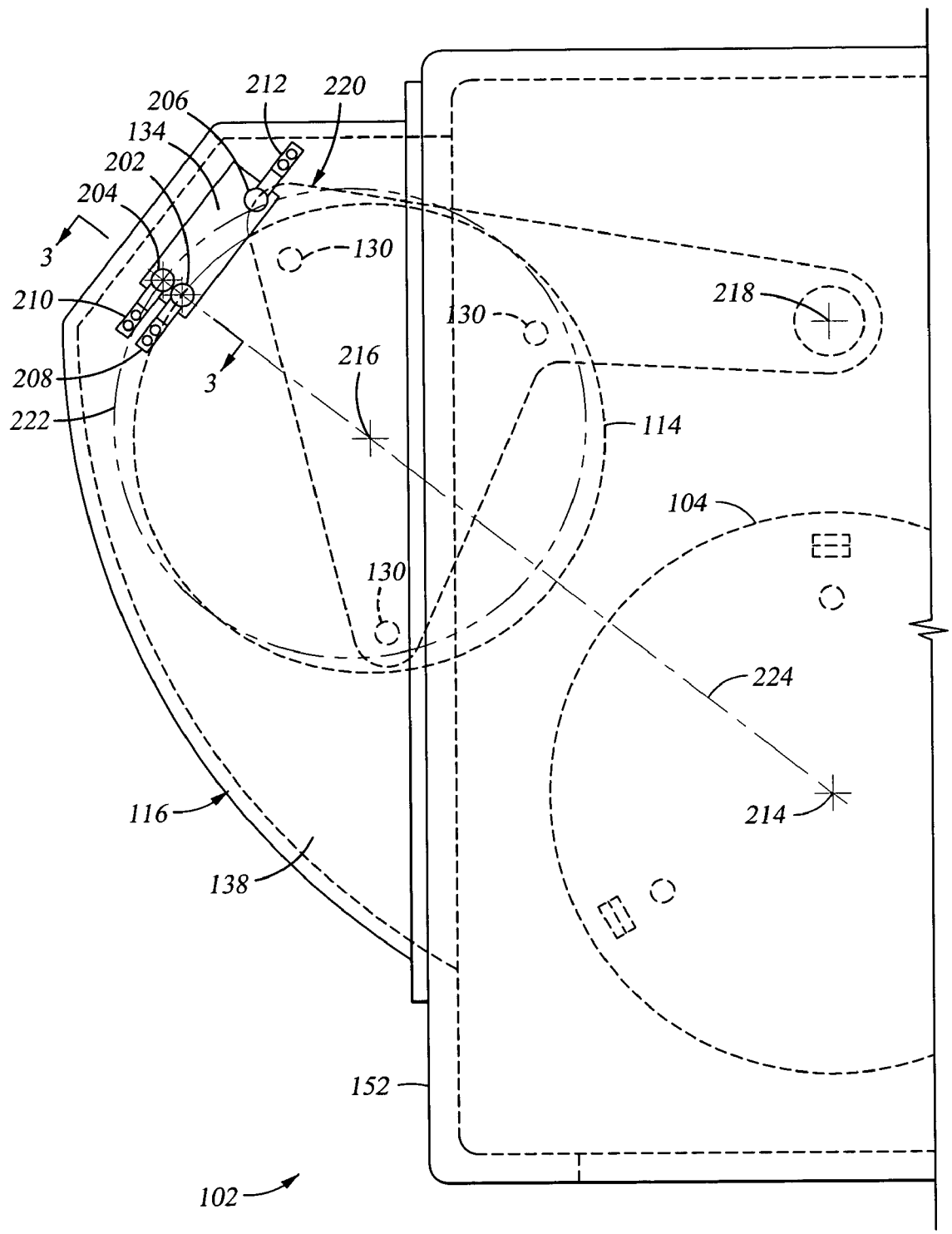
FIGS. 2A–B are sectional and plan views of a portion of the process chamber of FIG. 1.
Figure 2B:
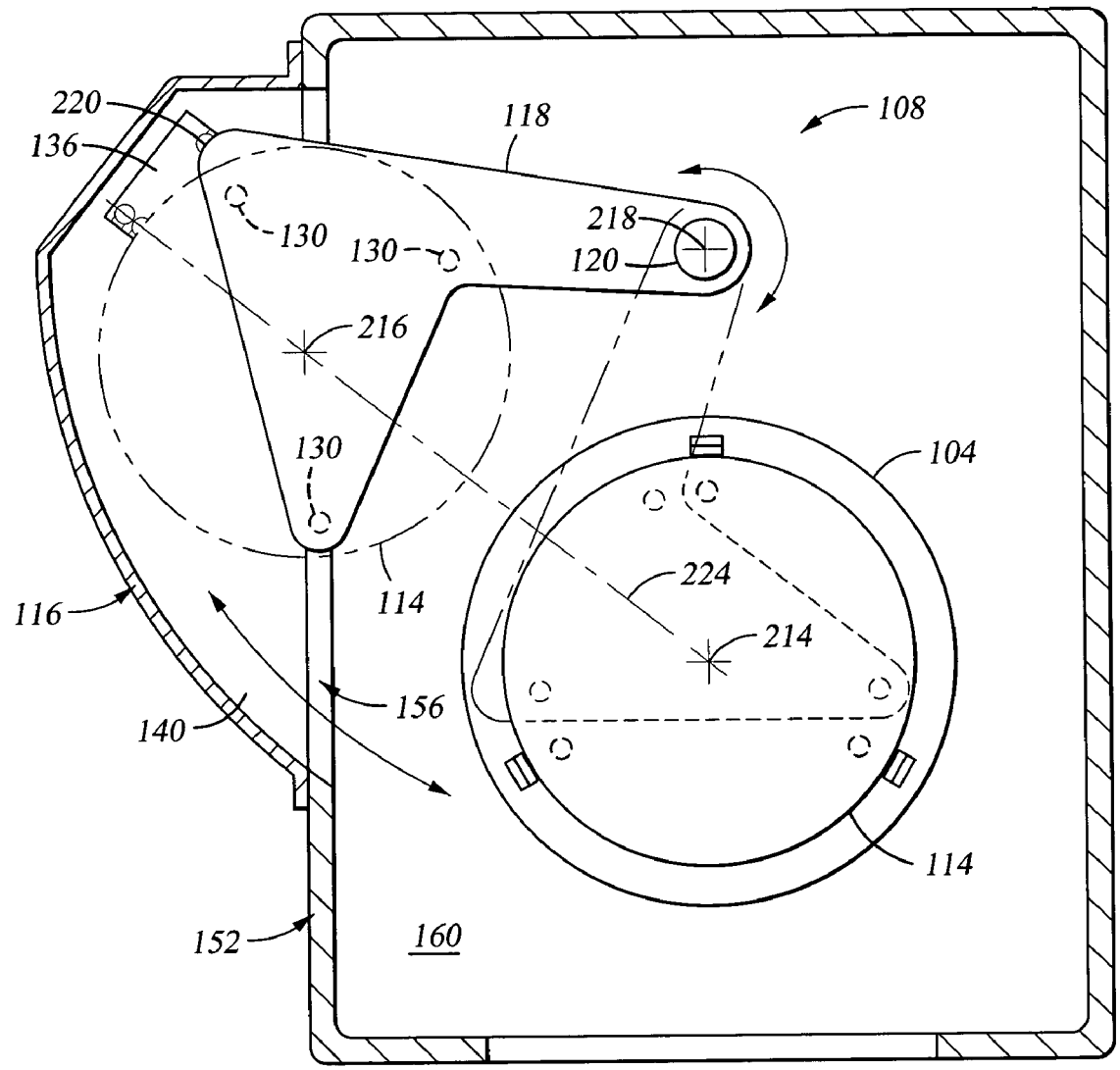

FIGS. 2A–B depict top and sectional plan views of the housing 116 illustrating one embodiment of the sensor assembly's position relative to the shutter disk 114, the blade 118 and the substrate support 104. The reader is encouraged to refer to both 2A–2B simultaneously.

In the embodiment depicted in FIGS. 2A–B, the sensor assembly includes a first sensor 202, a second sensor 204 and a third sensor 206. The sensors 202, 204 and 206 are respectfully coupled to the top 134 of the housing 116 by brackets 208, 210 and 212. The sensors 202, 204 and 206 generally provide a signal indicative of the presence of the shutter disk 114 and/or blade 118 thereunder.

The first and second sensors 202, 204 typically are positioned on a line 224 defined between a center point 214 of the substrate support 104 and reference point 216. The reference point 216 is generally located at the center of the shutter disk 114 when the shutter disk 114 is in the clear position (as shown). In one embodiment, the center and reference points 214, 216 are also equidistant from a central axis 218 of the shaft 120. The position of the sensors 202, 204 along the line 224 allows the sensors to provide a reliable indication that the shutter disk 114 is clear of the substrate support 104 as the line 224 lies along the shortest distance between the shutter disk 114 (when positioned correctly on the blade 118) and the substrate support 104.

The first sensor 202 generally detects the position of the shutter disk 114 when in the cleared position. The second sensor generally detects the shutter disk 222 when the disk is mis-positioned on the blade 118 but still detected by the first sensor 202 as shown by phantom shutter disk 222. For example, the shutter disk 222 may be positioned off-centered on the blade 118, which places the disk 222 further into the housing 116. Although the off-center position of the shutter disk 222 will still enable the substrate support to be moved vertically without contacting the shutter disk 222, the shutter disk 222 will be misaligned with the substrate support 104 when rotated to the second position for pasting or target burn-in, which will allow material to be disadvantageously deposited on the substrate support 104. Thus, the second sensor 204 indicates shutter disk 114 misalignment to the controller 190 which signals the operator or stops the production sequence at an appropriate point for service.

The third sensor 206 is generally positioned to view a portion or tab 220 of the blade 118 to indicate that the blade 118 is in the cleared position. The tab 220 of the blade 118 may be covered by the shutter disk 114 or extend beyond the shutter disk 114 to allow detection of the blade 118 when the disk 114 is also in the cleared position. Alternatively, the third sensor 206 may be positioned to view the substrate through the second window 134 or other window disposed in the housing 116.

Figure 3:
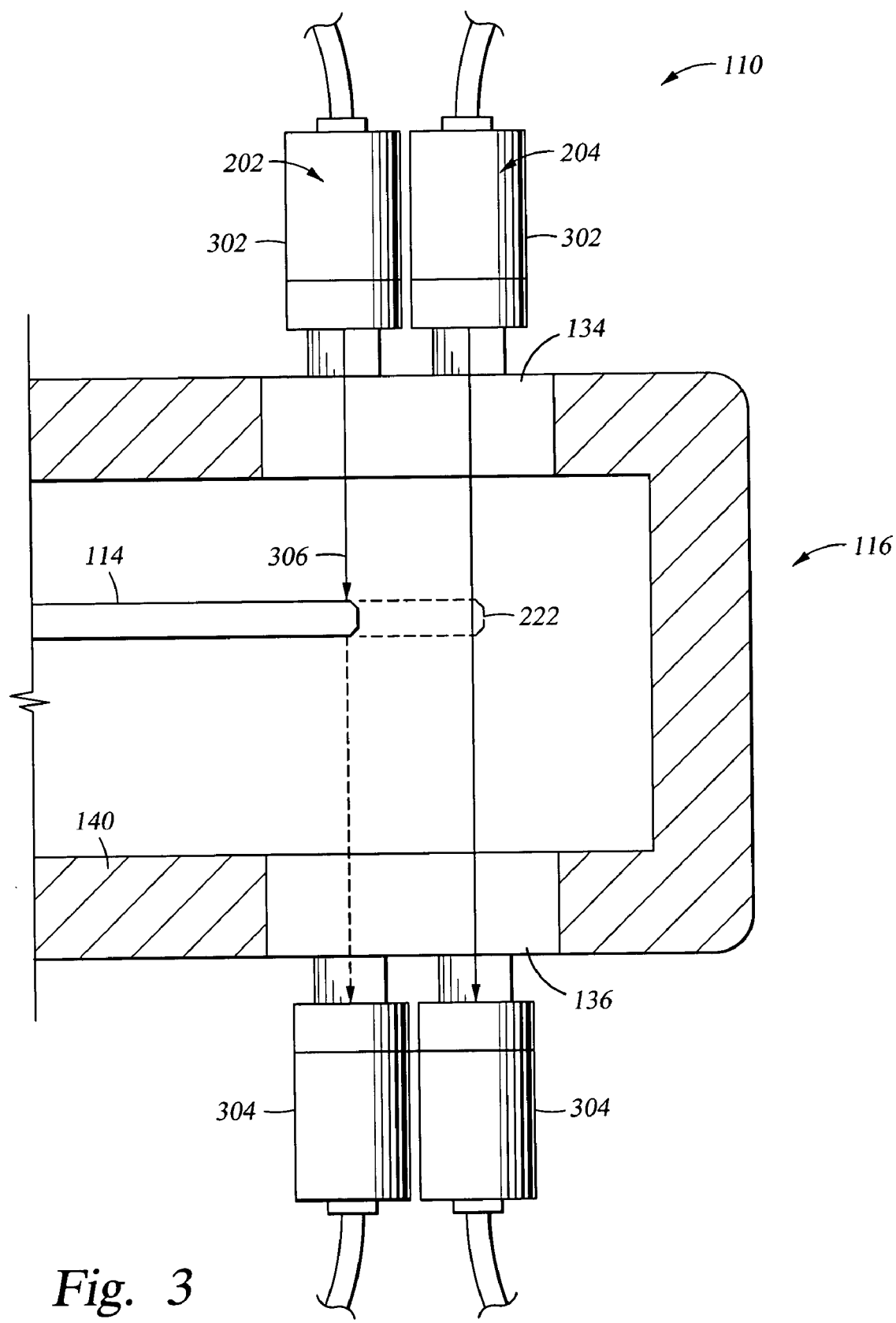
FIG. 3 depicts a sectional view of the sensor assembly taken along section line 3—3 of FIG. 2A.

FIG. 3 depicts a sectional view of one embodiment of the sensors 202, 204 taken along section line 3—3 in FIG. 2A. The sensors 202, 204 generally include an emitter 302 and a receiver 304. The emitter 302 generates a signal, such as a light beam 306, that passes through the windows 134, 136 and impinges upon the receiver 304. When the shutter disk 114 blocks or interrupts the beam 306, the sensors 202, 204 change state to indicate the presence of the shutter disk 114. Examples of sensors 202, 204 that may be utilized to detect the shutter disk 114 are available Banner Engineering Corporation, located in Minneapolis, Minn. Other types of sensors, including reflective sensors (i.e., a device having the emitter and receiver configured into a single unit) may alternatively be utilized. The third sensor 206 is similarly configured to detect the presence of the blade 118.

Figure 4:
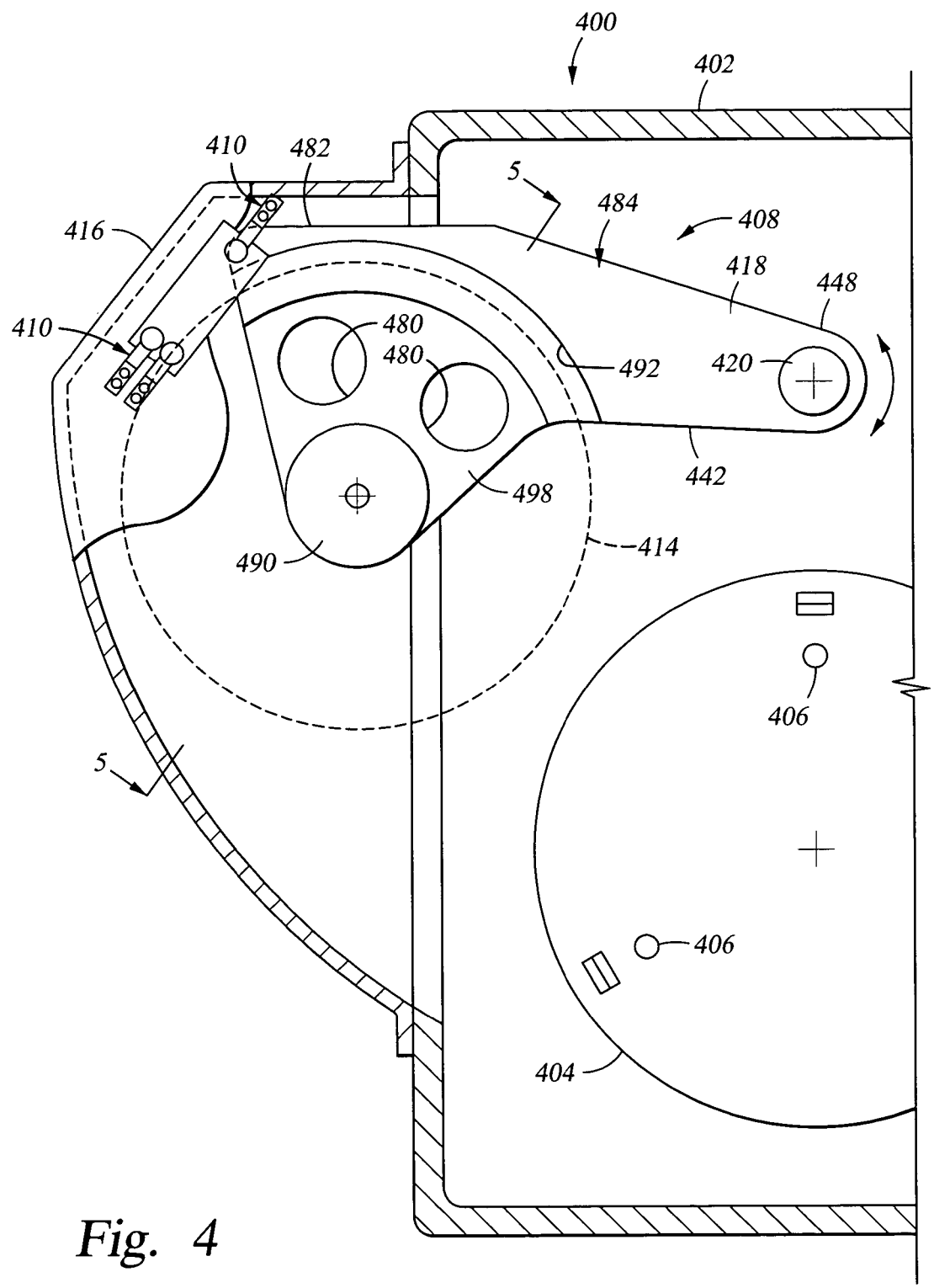
FIG. 4 depicts a partial cutaway view of another processing system having another embodiment of a shutter disk mechanism.

FIG. 4 depicts a partial cutaway view of an illustrative processing system 400 having another embodiment of a shutter disk mechanism 408 for selectively protecting a substrate support 404. The processing system 400 is generally similar to the processing system 100 described above, and includes a chamber body 402 coupled to housing 416 that provides a storage position of a shutter disk 414 (shown in phantom in FIG. 4) when moved clear of the substrate support 404 as shown.

The shutter disk mechanism 408 is generally disposed proximate the substrate support 404 and includes a blade 418 that supports the shutter disk 414. The blade 414 may be rotated about a shaft 420 between a first clear position having the shutter disk 414 at least partially disposed in the housing 416 (as shown in FIG. 4) and a second position that facilitates transfer of the shutter disk 414 to the substrate support 404 as described above (and as shown in FIG. 6).

The blade 418 is generally fabricated from a rigid material suitable for use in a vacuum processing environment, such as a physical vapor deposition chamber. In one embodiment, the blade 418 is fabricated from titanium. In another embodiment, the blade 418 and shutter disk 414 are fabricated from materials having substantially similar or identical coefficients of thermal expansion to minimize movement therebetween.

In one embodiment, the blade 418 has a body 442 that includes a hub 448, a support pad 490 and a lip groove 492. The hub 428 is coupled to the shaft 420 to facilitate rotation of the blade 418. The body 442 of the blade 418 is configured to allow rotation of the blade 418 from the second position to the cleared position without contacting the lift pins 406 extending from the substrate support 404.

The body 442 of the blade 418 may additionally include a tab 482 that extends beyond the perimeter of the shutter disk 414. The layout of the blade 418 is such that the tab 482 may be positioned to change an output state of a sensor assembly 410 when the blade 418 is retracted into the housing 416. The sensor assembly 410 may be configured similar to the sensor assembly 110 shown in FIG. 1A. The sensor assembly 410 may also be configured to interface with the blade 418 and shutter disk 414 similar to the sensor assembly 110, blade 118 and shutter disk 114 as described above.

Figure 5:
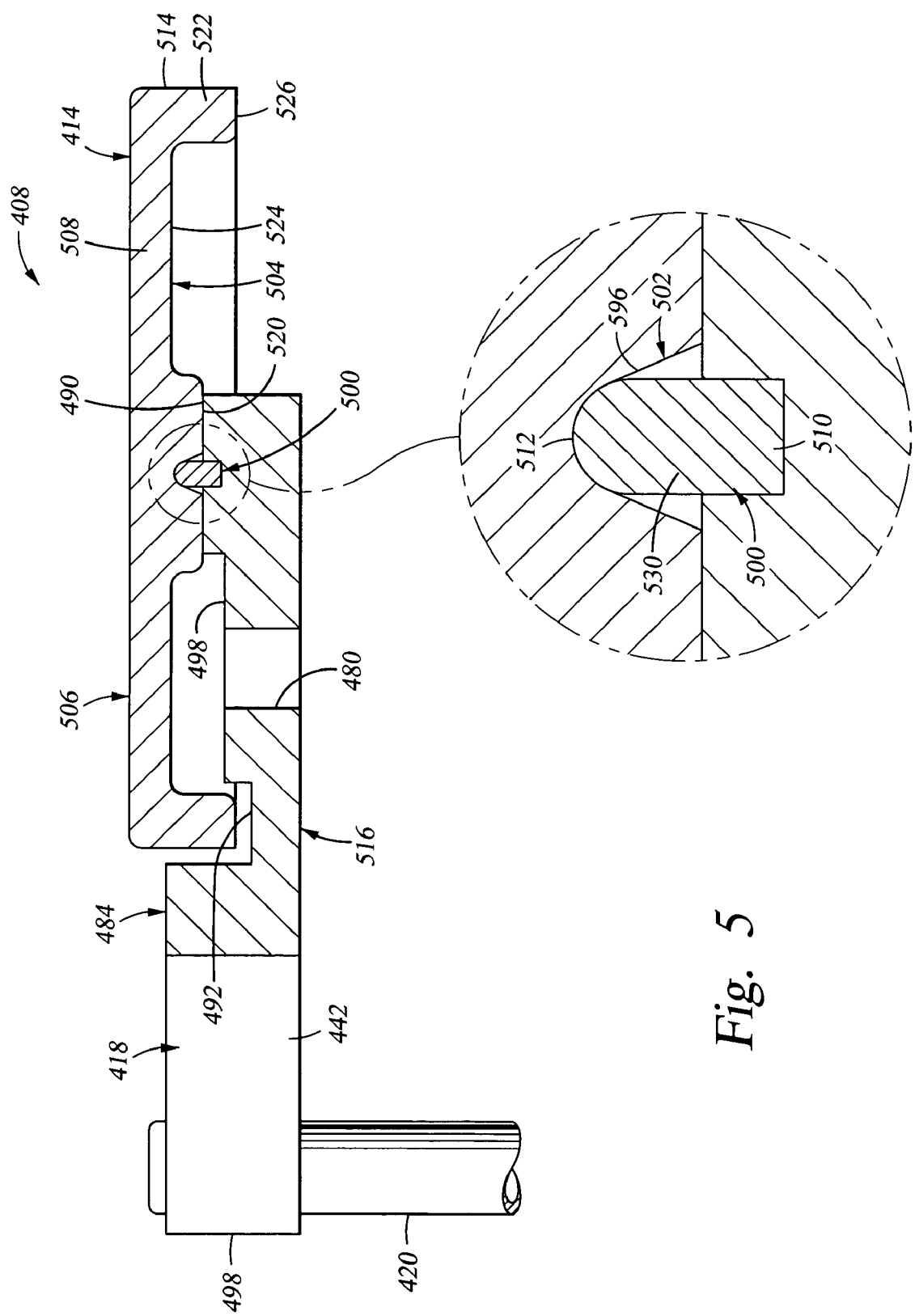
FIG. 5 depicts a sectional view of a blade and a shutter disk of the shutter disk mechanism of FIG. 4.

Referring additionally to the sectional view of the blade 418 and shutter disk 414 of FIG. 5, the support pad 490 of the blade 418 is disposed on an upper surface 484 of the blade 418. The support pad 490 is adapted to support a center pad 520 extending from a lower surface 504 of the shutter disk 414. The support pad 490 has a finish that minimizes particle generation between the blade 418 and shutter disk 414, and in one embodiment, is better than about 32 RMS.

The support pad 490 is interfaced with an alignment feature 500 configured to engage a lower surface 504 of the shutter disk 414. The alignment feature 500 retains the shutter disk 414 in a predefined orientation relative to the blade 418. The alignment feature 500 is generally centered at a radial distance from the centerline of the shaft 420 equal to the radial distance between the shaft 420 and a center of the substrate support 404. The alignment feature 500 is configured to prevent the shutter disk 414 from becoming disengaged from the blade 418 during transfer. As the alignment feature 500 is axially aligned with the center of the shutter disk 414, the need for rotational orientation between the disk 414 and the blade 418 is advantageously eliminated while maintaining alignment of the disk 414 and blade 418 through thermal changes without altering the ability of the blade 418 to seat the disk 414 in a predefined position (e.g., coaxially) on the substrate support 404.

In one embodiment, the alignment feature 500 is a post 530 extending between the support pad 490 and lower surface 504 of the shutter disk 414. The alignment post 530 may be an integral part of the body 442 of the blade 418 or comprise a separate element. It is also contemplated that the alignment post 530 may alternatively be part of the shutter disk 414 and may interface with a hole formed in the blade 418.

In the embodiment depicted in FIG. 5, the alignment post 530 has a first end 510 that is coupled to the shutter disk 414. The alignment post 530 may be coupled to the blade 418 through a variety of methods, including screwing, riveting, brazing, welding, press-fitting and staking among other methods. A second end 512 of the alignment post 530 is disposed opposite the first end 510 and is configured to engage a blind hole 502 formed in a lower surface 504 of the shutter disk 414.

The second end 512 of the alignment post 530 may be chamfered, rounded or tapered to facilitate alignment and engagement with the blind hole 502 of the shutter disk 414. In one embodiment, blind hole 502 may optionally include a flared sidewall 596 to further enhance entry of the post 530 into the blind hole 502

A clearance field 498 is formed in the upper surface 484 of the blade 418 and laterally separates the support pad 490 and the lip groove 492. The clearance field 498 is generally at a lower elevation relative a lower surface 516 of the blade 418 than the support pad 490 and at a higher elevation relative the lower surface 516 than the lip groove 492. The lower elevation of the clearance field 498 allows the shutter disk 414, when supported on the support pad 490, to be maintained in a spaced-apart relation with the remainder of the blade 418.

The shutter disk 414 is generally a substantially disk-shaped body 508 defined between the lower surface 504 and an upper surface 506. The body 508 may be fabricated from materials suitable for using in a PVD chamber, for example stainless steel or titanium, among other materials. In one embodiment, the body 508 is fabricated from a material having a substantially similar or identical coefficient of thermal expansion relative to a material comprising the blade 418. Optionally, holes 480 may be formed through the body 442 of the blade 418 to minimize the moment of inertia, weight and thermal inertia of the blade 418.

The lower surface 504 of the shutter disk 418 includes a center pad 520 and a downwardly extending annular lip 522. The center pad 520 is configured to interface with the alignment feature 500 of the blade 418, and in the embodiment depicted in FIG. 5, includes the blind hole 502 formed in the center pad 520 axially along a centerline of the shutter disk 418. Generally, the center pad 520 has a surface finish similar to that of the support pad 490 of the blade 418 (i.e., at least as smooth as about 32 RMS) to minimize particle generation therebetween.

The shutter disk 414 may include a recess 524 that separates the center pad 520 and the lip 522. The recess 524 allows the bulk of the shutter disk 414 to remain clear of the blade 418 while the shutter disk 414 is seated on the blade 418.

Figure 6:
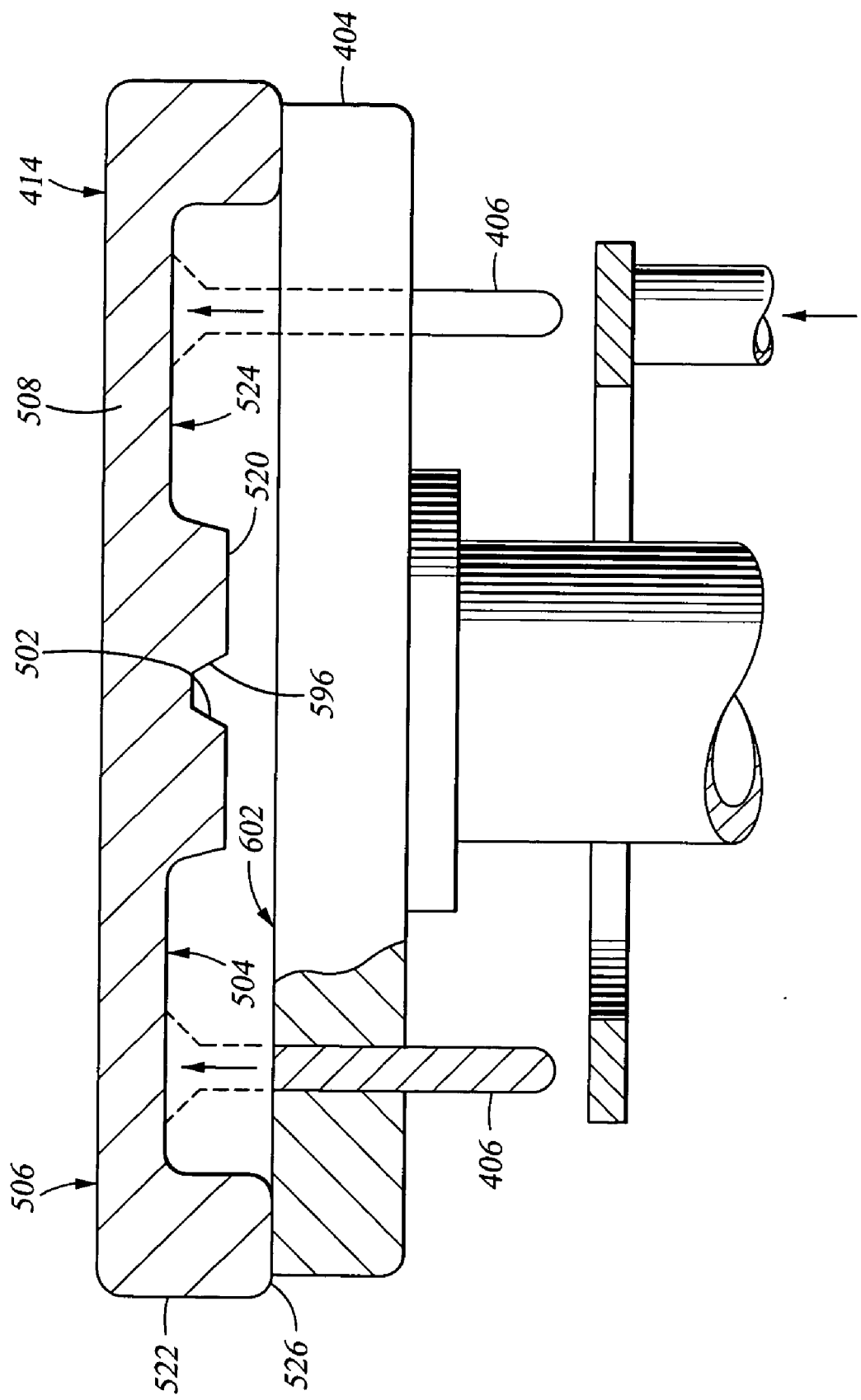
FIG. 6 depicts the shutter disk of FIG. 5 disposed on a substrate support.

Referring now to FIGS. 5 and 6, the lip 522 is positioned proximate a perimeter 514 of the shutter disk 414 and extends downward to a lip face 526. The lip face 526 is oriented on a plane parallel to a plane defined by the center pad 520 and perpendicular to the centerline of the disk body 508. The lip 522 extends from the lower surface 504 beyond the elevation of the center pad 520 and recess 524. The height of the lip 522 is selected to provide separation between the disk body 508 and substrate support 404 (as seen in FIG. 6) while remaining spaced-apart from lip groove 492 when the shutter disk 414 is carried on the blade 418.

The lip 522 is generally configured to have a diameter about equal to or greater than a diameter of an upper surface 602 of the substrate support 404. The extended lip 522 allows the shutter disk 414 to be positioned on the substrate support 404 in an orientation that prevents the upper surface 602 of the substrate support 404 from being exposed during selected conditioning processes while maintaining the center pad 520 and recess 524 in a spaced-apart relation relative to the substrate support 404. As the lip 522 is relatively narrow, the contact area between the substrate support 404 and shutter disk 414 is minimized to minimize particle generation and potential damage to the substrate support 404 during conditioning processes.

Thus, embodiments of the invention have been provided that describe a shutter disk mechanism that advantageously facilitates protection of a substrate support during conditioning processes. In one embodiment, the shutter disk mechanism provides positional information regarding the shutter disk. In another embodiment, the shutter disk mechanism includes an alignment feature that advantageously eliminates the need for rotational orientation of the shutter disk to the blade.

While the foregoing is directed to the preferred embodiment of the present invention, other and further embodiments of the invention may be devised without departing from the basic scope thereof, and the scope thereof is determined by the claims that follow.

What is claimed is:

1. A shutter disk for covering a substrate support in a physical vapor deposition chamber comprising:
    a disk body defined by an outer edge, a top surface extending to the outer edge and a lower surface disposed opposite the top surface, wherein the lower surface further comprises:
        a center pad extending from the lower surface;
        a recess formed in the center pad coaxially with the disk body; and
        a lip extending from the lower surface proximate the outer edge, the lip extending below the center pad.

2. The shutter disk of claim 1, wherein the center pad is perpendicular to a center axis of the disk body.

3. The shutter disk of claim 2, wherein the center pad has a surface finish better than about 32 RMS.

4. The shutter disk of claim 1, wherein the disk body is fabricated from stainless steel or titanium.

5. The shutter disk of claim 4, wherein the recess further comprises outward flaring sidewalls.

6. A shutter disk for covering a substrate support in a physical vapor deposition chamber comprising:
    a disk body having a center axis and defined by an outer edge, a top surface extending to the outer edge and a lower surface disposed opposite the top surface, wherein the lower surface further comprises:
        a center pad extending from the lower surface;
        a blind hole having outwardly flaring sides formed in the center pad along the center axis of the disk body;
        a lip extending from the lower surface proximate the outer edge, the lip extending below the center pad to a lip face that is parallel to the center pad; and
        an annular recess formed in the lower surface between the center pad and lip.

7. A physical vapor deposition chamber comprising:
    a chamber body having sidewalls and a bottom defining a process volume;
    a substrate support;
    a housing sealingly coupled to the chamber body;
    a disk body having a center axis and defined by an outer edge, a top surface extending to the outer edge and a lower surface disposed opposite the top surface, wherein the lower surface further comprises a center pad extending from the lower surface and a lip extending from the lower surface proximate the outer edge, the lip extending below the center pad;
    a robot having a blade adapted to move the disk body between the housing and chamber body; and
    an alignment feature disposed between the center pad and the blade, wherein the alignment feature engages the disk body along the center axis.

8. The chamber of claim 7 further comprising:
    at least a first sensor disposed adjacent to the housing and orientated to detect the presence of a portion of at least one of the disk body or blade within the housing.

9. The chamber of claim 7, wherein the center pad is perpendicular to the center axis of the disk body.

10. The chamber of claim 7, wherein the center pad has a surface finish better than about 32 RMS.

11. The chamber of claim 7, wherein the disk body is fabricated from stainless steel or titanium.

12. The chamber of claim 7, wherein the robot blade is fabricated from titanium.

13. The chamber of claim 7, wherein the robot blade further comprises:
    a raised pad configured to support the center pad.

14. The chamber of claim 13, wherein the alignment feature comprises:
    a post engaging the raised pad and center pad.

15. The chamber of claim 14, wherein the post is coupled to the raised pad and mates with a blind hole formed in the center pad.

16. The chamber of claim 15, wherein the blind hole has a tapered sidewall.

17. The chamber of claim 7, wherein the robot blade further comprises:
    a groove formed therein having a portion of the lip mated therewith, the groove configured to maintain a gap between the robot blade and lip of the disk body.

18. The processing chamber of claim 7 further comprising:
    a first window formed in the housing; and
    a first sensor positioned to view at least one of the disk body or robot blade through the first window.

19. The processing chamber of claim 18 further comprising:
    a second sensor disposed adjacent to the housing and orientated to detect the presence within the housing of the shutter mechanism.

20. The chamber of claim 19, further comprising:
    a third sensor disposed adjacent to the first and second sensors, the third sensor orientated to detect the presence of the blade within the housing.

21. The processing chamber of claim 18, wherein the housing further comprises:
an emitter disposed proximate the first window; and
a receiver disposed proximate a second window disposed in the housing opposite the first window, the receiver linearly aligned with the emitter, first window and second window.

22. A physical vapor deposition chamber comprising:
a chamber body having sidewalls and a bottom defining a process volumes wherein a slot is formed through one of the sidewalls;
a shutter disk mechanism at least partially disposed in the process volume and having a robot blade and a shutter disk engaged by an alignment feature, the alignment feature disposed along a center axis of the shutter disk, wherein the shutter disk has a lower surface comprising:
a center pad near the center axis; and
a lip extending along an outer edge of the shutter disk and extending below the center pad; and
a housing sealingly coupled to the chamber body.

23. The chamber of claim 22, further comprising:
at least a first sensor disposed adjacent to the housing and orientated to detect the presence of a portion of the shutter disk mechanism within the housing.

24. The chamber of claim 23, wherein the center pad is perpendicular to the center axis of the disk body and parallel to the lip.

25. The chamber of claim 23, wherein the disk body and robot blade are fabricated from materials having substantially similar or identical coefficients of thermal expansion.

26. The chamber of claim 23, wherein the robot blade further comprises:
a raised pad configured to support the center pad.

27. The chamber of claim 26, wherein the alignment feature comprises:
a post engaging the raised pad and center pad.

28. The chamber of claim 27, wherein the post is coupled to the raised pad and mates with a blind hole formed in the center pad.

29. The chamber of claim 28, wherein the blind hole has a tapered sidewall.

30. The chamber of claim 23, wherein the robot blade further comprises:
a groove formed therein having a portion of the lip mated therewith, the groove configured to maintain a gap between the robot blade and lip of the disk body.

31. A method for positioning a shutter disk within a physical vapor deposition chamber having a substrate support, comprising:
spacing a shutter disk vertically from a substrate support;
moving a robot blade between the substrate support and the shutter disk; and
engaging the shutter disk and the robot blade by coupling a post disposed on the robot blade with an alignment feature disposed along a center axis of the shutter disk.

32. The method of claim 31 further comprising:
setting the shutter disk on a perimeter of the substrate support wherein center portions of the shutter disk and substrate support remain in a spaced-apart relation.

33. A physical vapor deposition chamber comprising:
a chamber body having sidewalls and a bottom defining a process volume;
a shutter disk mechanism at least partially disposed in the process volume and having a robot blade and a shutter disk engaged by an alignment feature, the alignment feature disposed along a center axis of the shutter disk;
a slot formed through one of the sidewalls;
a housing sealingly coupled to the chamber body; and
at least a first sensor disposed adjacent to the housing and orientated to detect the presence of a portion of the shutter disk mechanism within the housing.

34. The chamber of claim 33, wherein the robot blade further comprises:
a groove formed therein having a portion of the lip mated therewith, the groove configured to maintain a gap between the robot blade and lip of the disk body.

35. A method for positioning a shutter disk within a physical vapor deposition chamber having a substrate support, comprising:
spacing a shutter disk vertically from a substrate support;
moving a robot blade between the substrate support and the shutter disk;
engaging the shutter disk and the robot blade with an alignment feature disposed along a center axis of the shutter disk; and
setting the shutter disk on a perimeter of the substrate support wherein center portions of the shutter disk and substrate support remain in a spaced-apart relation.

* * * * *

UNITED STATES PATENT AND TRADEMARK OFFICE
CERTIFICATE OF CORRECTION

PATENT NO. : 7,008,517 B2  Page 1 of 1
APPLICATION NO. : 10/626471
DATED : March 7, 2006
INVENTOR(S) : Michael Feltsman It is certified that error appears in the above-identified patent and that said Letters Patent is hereby corrected as shown below:

Column 6, Line 18: Change "respectfully" to --respectively--

Column 7, Line 36: Change "428" to --448--

<u>In the Claims</u>

Column 11, Claim 22, Line 10: Change "volumes" to --volume,--

Signed and Sealed this

Twelfth Day of February, 2008

JON W. DUDAS
*Director of the United States Patent and Trademark Office*